US008026036B2

(12) United States Patent
Tokuhisa et al.

(10) Patent No.: US 8,026,036 B2
(45) Date of Patent: Sep. 27, 2011

(54) PHOTOSENSITIVE RESIN COMPOSITION AND CIRCUIT SUBSTRATE EMPLOYING THE SAME

(75) Inventors: Kiwamu Tokuhisa, Kisarazu (JP); Kentaro Hayashi, Kisazaru (JP); Hironobu Kawasato, Kisarazu (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 489 days.

(21) Appl. No.: 11/887,420

(22) PCT Filed: Mar. 24, 2006

(86) PCT No.: PCT/JP2006/305937
§ 371 (c)(1),
(2), (4) Date: Mar. 26, 2009

(87) PCT Pub. No.: WO2006/109514
PCT Pub. Date: Oct. 19, 2006

(65) Prior Publication Data
US 2009/0202786 A1 Aug. 13, 2009

(30) Foreign Application Priority Data

Mar. 30, 2005 (JP) .................................. 2005-098369

(51) Int. Cl.
*G03F 7/00* (2006.01)
*G03F 7/004* (2006.01)
(52) U.S. Cl. ................... 430/270.1; 430/281.1; 430/311; 430/319; 430/322; 430/913; 430/919; 430/945; 430/920
(58) Field of Classification Search ............... 430/270.1, 430/281.1, 311, 319, 322, 913, 919, 945, 430/920; 522/31, 164, 99
See application file for complete search history.

(56) References Cited

U.S. PATENT DOCUMENTS

| 5,756,260 | A | * | 5/1998 | Sashida et al. ............. 430/283.1 |
| 5,914,354 | A | * | 6/1999 | Kato ............................... 522/99 |
| 6,146,815 | A | * | 11/2000 | Komatsu et al. ............. 430/331 |
| 2002/0001763 | A1 | | 1/2002 | Yasuno et al. |
| 2006/0068330 | A1 | * | 3/2006 | Kamijima .................... 430/311 |

FOREIGN PATENT DOCUMENTS

| EP | 478321 A1 * | 4/1992 |
| JP | 1-283554 | 11/1989 |
| JP | 4-300921 | 10/1992 |
| JP | 07-207211 | 8/1995 |
| JP | 9-110350 | 4/1997 |
| JP | 2000-221681 | 8/2000 |
| JP | 2002-006490 | 1/2002 |
| JP | 2002-162736 | 6/2002 |
| JP | 2004-294882 | 10/2004 |

OTHER PUBLICATIONS

Notification of Transmittal of Translation of the International Preliminary Report on Patentability for PCT/JP2006/305937.
Notification Concerning Transmittal of International Preliminary Report on Patentability for PCT/JP2006/305937.
International Search Report for International Application No. PCT/JP2006/305937, dated Apr. 18, 2006.

* cited by examiner

*Primary Examiner* — Amanda C. Walke
(74) *Attorney, Agent, or Firm* — Edwards Angell Palmer & Dodge LLP

(57) ABSTRACT

The present invention relates to a photosensitive resin composition excellent in pliability, ultraviolet sensitivity for development, developability with an aqueous alkali solution, and storage stability at room temperature and a circuit substrate employing the same. The photosensitive resin composition includes a siloxane-containing polyamic acid resin having structural units respectively represented by the following formulae (1), (2), and (3) and a photopolymerization initiator incorporated therein. The circuit substrate is coated with the photosensitive resin composition.

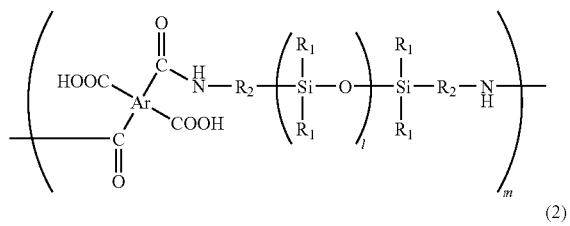

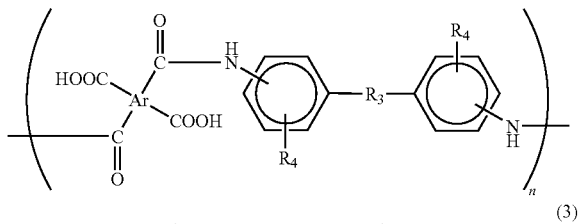

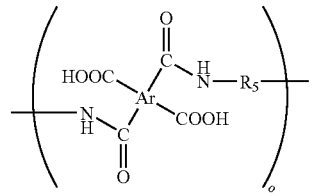

In the formulae, Ar represents a residue of an aromatic tetracarboxylic acid; $R_1$ represents alkyl group having 1 to 6 carbon atoms or phenyl group; $R_2$ represents alkylene group having 2 to 6 carbon atoms or phenylene group; l represents a number of 0 to 10; $R_3$ represents a divalent group or a direct bond; $R_4$ represents —$CH_2$=CH—$R_6$—, in which $R_6$ represents a direct bond, alkylene group having 1 to 6 carbon atoms, or phenylene group; $R_5$ represents a diamine residue; and m, n, and o, indicating the range of the abundant molar ratios of the respective structural units, are 0.3 to 0.95, 0.05 to 0.7, and 0 to 0.5, respectively.

10 Claims, No Drawings

PHOTOSENSITIVE RESIN COMPOSITION AND CIRCUIT SUBSTRATE EMPLOYING THE SAME

TECHNICAL FIELD

The present invention relates to a photosensitive resin composition containing a novel siloxane-containing polyamic acid resin and an insulating-coating circuit substrate using the same. More specifically, the present invention relates to a photosensitive resin composition containing a novel siloxane-containing polyamic acid resin suitable for forming a resist composition for printed wiring board and a cured film thereof, and an insulating-coating circuit substrate using the same.

BACKGROUND ART

In recent years, ULTRAVIOLET-curable photosensitive resin compositions have been abundantly used in a wide variety of fields, such as coating materials, adhesives, and resists, because of various reasons including high productivity, low-pollution, and energy-saving properties. In the field of processing printed wiring boards, cover materials for various ink systems, such as solder resist ink, are being replaced from the conventional screen-printing system to ULTRAVIOLET-curable compositions. In addition, remarkable progresses in electron technologies allow the conventional rigid substrates to be substituted by flexible substrates because of advancing high-density and weight-saving technologies.

In general, in the case of using ink as a covering material, as the characteristics of the covering material after curing, the covering material used for a rigid substrate does not need pliability so much, but in the case of using a covering material for a flexible substrate, the cover material has been desired to be high in pliability in order to employ the characteristic features of the flexible substrate.

Further, JP 07-207211 A describes a curable photosensitive material including an epoxy resin, an unsaturated group-containing polycarboxylic acid resin provided as a reaction product of an unsaturated group-containing monocarboxylic acid and an carboxylic acid anhydride, and a photopolymerization-initiator. However, such a material has poor folding-endurance characteristics because of a lack in sufficient flexibility or pliability. Besides, a trouble such as the substrate warps after processing occurs. An improvement in such a trouble has been demanded in various fields. For this reason, as shown in JP 2004-294882 A, a composition containing a siloxane polyimide as a main component for expressing low elasticity has been proposed. In those compositions, warping of a substrate after processing may be decreased, but the compositions may cause problems of high price and poor storage stability of the composition at room temperature.

Patent Document 1: JP 07-207211 A
Patent Document 2: JP 2004-294882 A

DISCLOSURE OF THE INVENTION

Problems to be Solved by the Invention

The present invention intends to provide a photosensitive resin composition that imparts pliability to a cured material, as well as providing an insulating coating which has excellent flexibility in folding-endurance and in flexing, and is excellent in storage stability at room temperature, but does not require a high-temperature treatment when curing or processing.

The inventors of the present invention have intensively studied and investigated for solving the above-mentioned problems and as a result finally found out that a photosensitive resin composition containing a polyamic acid resin provided with a specific siloxane portion and a aromatic portion having an unsaturated group can solve the above-mentioned problems, thereby completing the present invention.

That is, the present invention provides a photosensitive resin composition, prepared by combining 1 to 20 parts by weight of a photopolymerization initiator as an essential component with respect to 100 parts by weight of a siloxane-containing polyamic acid resin containing 30 to 95 mol % of a structural unit represented by the following formula (1), 5 to 70 mol % of a structural unit represented by the following formula (2), and 0 to 50 mol % of a structural unit represented by the following formula (3):

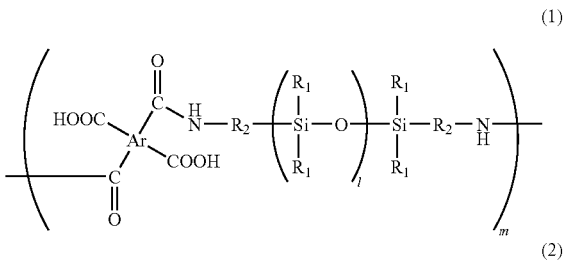

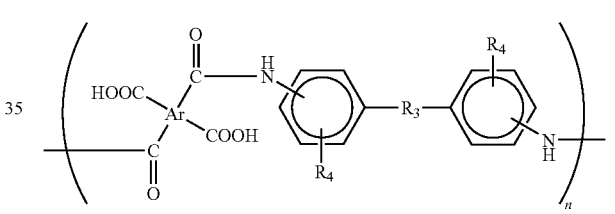

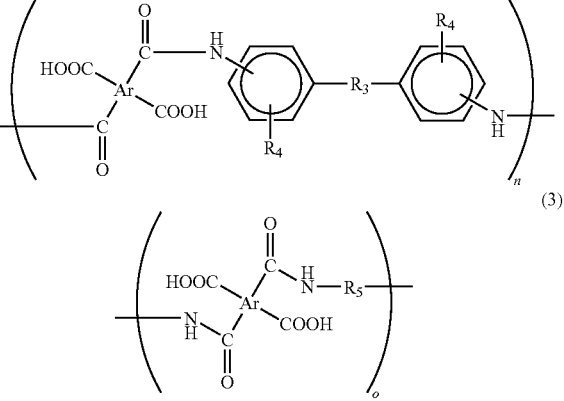

in the formulae, Ar represents a tetravalent tetracarboxylic acid residue in which carboxyl groups are removed from an aromatic tetracarboxylic acid, $R_1$ represents an alkyl group having 1 to 6 carbon atoms or phenyl group, $R_2$ represents an alkylene group having 2 to 6 carbon atoms or phenylene group, l represents a number of 0 to 10, $R_3$ represents a divalent group or a direct bond, $R_4$ represents a group represented by $CH_2=CH-R_6-$, $R_6$ represents a direct bond, an alkylene group having 1 to 6 carbon atoms, or a phenylene group, $R_5$ represents a divalent diamine residue in which an amino group is removed from a diamine compound, except in the case of the divalent diamine residue being diamine residues in the formulae (1) and (2), and m, n, and o represent abundant molar ratios of the respective structural units, where m is in the range of 0.3 to 0.95, n is in the range of 0.05 to 0.7, and o is in the range of 0 to 0.5. As shown in formulae (1) to (3) may be identical with or different from each other.

The photosensitive resin composition may be prepared with 1 to 20 parts by weight of the photopolymerization initiator and 5 to 60 parts by weight of a monofunctional or polyfunctional acrylate combined as essential components with respect to 100 parts by weight of a siloxane-containing polyamic acid resin.

In addition, the present invention provides a varnish-like photosensitive resin composition prepared by dissolving the above photosensitive resin composition in a solvent. Further, the present invention provides a film-shaped photosensitive resin composition prepared by applying and drying the above varnish-like photosensitive resin composition on a substrate film. Still Further, the present invention provides a circuit substrate on which a negative-type insulating coating is formed such that the above photosensitive resin composition is applied on a circuit substrate having a conductive layer being pattered thereon to form a coating and then subjected to exposure, development, and curing.

Hereinafter, the present invention will be described in detail.

The siloxane-containing polyamic acid resin has structural units represented by the above formulae (1) and (2), and also preferably having a structural unit represented by the formula (3). In the formulae (1), (2), and (3), Ar represents a tetravalent tetracarboxylic acid residue, which is one obtained by removing carboxyl groups from an aromatic tetracarboxylic acid, and Ars may be identical with or different from each other or may be two or more different ones.

In the formula (1), $R_1$ represents an alkyl group having 1 to 6 carbon atoms or phenyl group, preferably an alkyl group having 1 to 2 carbon atoms. $R_2$ represents an alkylene group having 2 to 6 carbon atoms or phenylene group, preferably an alkyl group having about 2 to 4 carbon atoms. l represents a number of 0 to 10 and preferably 7 to 10 on average. The amount of the structural unit represented by the formula (1) being present in the resin is in the range of 30 to 95 mol %, preferably 40 to 90 mol %, more preferably 50 to 80 mol %.

In the formula (2), $R_3$ represents a divalent group or a direct bond, preferably any one of a direct bond, $CH_2$, $C(CH_3)_2$, and $SO_2$. $R_4$ is a group represented by $CH_2=CH-R_6-$, and $R_6$ represents a direct bond, an alkylene group having 1 to 6 carbon atoms, or a phenylene group. Preferably, $R_4$ is a vinyl group in terms of reactivity. The amount of the structural unit represented by the formula (2) being present in the resin is in the range of 5 to 70 mol %, preferably 5 to 30 mol %.

In the formula (3), $R_5$ represents a divalent diamine residue but not any diamine residue in the formulae (1) and (2). The amount of the structural unit represented by the formula (3) being present in the resin is in the range of 0 to 50 mol %, preferably 5 to 30 mol %.

The structural units represented by the above formulae (1) to (3) have amic acid bonds such as those obtained by reactions of diamines with aromatic tetracarboxylic acids, where a part thereof may be imidized. However, in order to secure good property in alkaline development, the rate of imidization is preferably less than 30%.

In each of the formulae (1) to (3), Ar represents a tetravalent residue of an aromatic tetracarboxylic acid, which is one obtained by removing carboxyl groups from an aromatic tetracarboxylic acid. Aromatic tetracarboxylic dianhydrides are often used as the aromatic tetracarboxylic acids. Thus, some aromatic tetracarboxylic acids will be described as examples of Ar. The aromatic tetracarboxylic dianhydrides include pyromellitic dianhydride, 2,2',3,3'-, 2,3,3',4'- or 3,3',4,4'-beonzophenone tetracarboxylic dianhydride, 2,3,6,7-, 1,2,4,5-, 1,4,5,8-, 1,2,6,7-, or 1,2,5,6-naphthalene-tetracarboxylic dianhydride, 4,8-dimethyl-1,2,3,5,6,7-hexahydronaphthalene-1,2,5,6-tetracarboxylic dianhydride, 2,6- or 2,7-dichloronaphthalene-1,4,5,8-tetracarboxylic dianhydride, 2,3,6,7-(or 1,4,5,8-) tetrachloronaphthalene-1,4,5,8-(or 2,3,6,7-) tetracarboxylic dianhydride, 3,3',4,4'-, 2,2',3,3'-, or 2,3,3',4'-biphenyl tetracarboxylic dianhydride, 3,3'',4,4''-, 2,3,3'',4''-, or 2,2'',3,3''-p-terphenyl tetracarboxylic dianhydride, 2,2-bis(2,3,- or 3,4-dicarboxyphenyl)-propane dianhydride, bis(2,3-dicarboxyphenyl)ether dianhydride, bis(2,3- or 3,4-dicarboxyphenyl)methane dianhydride, bis(2,3- or 3,4-dicarboxyphenyl)sulfone dianhydride, 1,1-bis(2,3- or 3,4-dicarboxyphenyl)ethane dianhydride, 2,3,8,9-, 3,4,9,10-, 4,5,10,11-, or 5,6,11,12-perylene-tetracarboxylic dianhydride, 1,2,7,8-, 1,2,6,7-, or 1,2,9,10-phenathrene-tetracarboxylic dianhydride, cyclopentane-1,2,3,4-tetracarboxylic dianhydride, pyrazine-2,3,5,6-tetracarboxylic acid dianhydride, pyrrolidine-2,3,4,5-tetracarboxylic dianhydride, thiophene-2,3,4,5-tetracarboxylic dianhydride, and 4,4'-oxydiphthalic dianhydride. In addition, they may be individually provided or provided in combination of two or more. Advantageous examples include pyromellitic anhydride, 4,4'-oxydiphthalic dianhydride, benzophenone tetracarboxylic dianhydride, biphenyl tetracarboxylic dianhydride, and biphenylether tetracarboxylic dianhydride. Among them, benzophenone tetracarboxylic dianhydride and biphenyl tetracarboxylic dianhydride are preferable.

In the formula (3), $R_5$ represents a divalent residue, such as any of diamine compounds from which amino group are removed, excluding diamine compounds contained in the formulae (1) and (2) as described above. $R_5$ will be described as follows by way of representing diamine compounds. The compounds include p-phenylenediamine, m-phenylenediamine, 4,4'-diaminodiphenyl methane, 4,4'-diaminophenyl ethane, 4,4'-diaminophenyl ether, 4,4'-di-diaminophenyl sulfide, 4,4'-di-diaminophenyl sulfone, 1,5-diaminonaphthalene, 3,3-dimethyl-4,4'-diaminobiphenyl, 5-amino-1-(4'-aminophenyl)-1,3,3-trimethyl indan, 4,4'-diaminobenzanilide, 3,5-diamino-4'-trifluoromethyl benzanilide, 3,4'-diaminodiphenyl ether, 2,7-diaminofluorene, 2,2-bis(4-aminophenyl)hexafluoropropane, 4,4'-methylene-bis (2-chloroaniline), 2,2',5,5'-tetrachloro-4,4'-diaminobiphenyl, 2,2'-dichloro-4,4'-diamino-dimethoxybiphenyl, 3,3'-dimethoxy-4,4'-diaminobiphenyl, 4,4'-diamino-2,2'-bis(trifluoromethyl)biphenyl, 2,2-bis[4-(4-aminophenoxy)phenyl]propane, 2,2-bis[4-(4-aminophenoxy)phenyl]hexafluoropropane, 1,4-bis(4-aminofenoxy)benzene, 4,4'-bis(4-aminophenoxy)biphenyl, 1,3'-bis(4-aminophenoxy) benzene, 9,9-bis(4-aminophenyl)fluorene, 4,4'-(p-phenyleneisopropylidene)bisaniline, 4,4'-(m-phenyleneisopropylidene)bisaniline, 2,2'-bis[4-(4-amino-2-trifluoromethyl)phenoxy]-octafluorobiphenyl, hydroxy aminobiphenyl, and the like.

An example of the method for manufacturing a siloxane-containing polyamic acid resin to be used in the present invention will be described. First, an aromatic acid dianhydride is added to a solvent and dissolved therein. While stirring the mixture, two or more kinds of diamines including siloxane diamine are gradually added under ice-cold conditions and nitrogen atmosphere. Subsequently, the mixture is reacted while stirring for 2 to 8 hours, and thus a siloxane-containing polyamic acid resin is obtained. The siloxane-containing polyamic acid resin thus obtained is a mixture with a different polymerization degree. Further, it may be prepared as a random polymerization or block polymerization type polyamic acid resin by altering the method of adding diamine or the like.

The solvent used in the above reaction may be any of organic solvents including triethylene glycol dimethyl ether, diethylene glycol dimethyl ether, dimethyl acetamide, and N-methyl pyrrolidone, or mixture solvents thereof.

The acid dianhydride and the diamine are preferably combined almost in equal moles. In addition, the reaction is preferably carried out at almost 0° C. so that polymerization takes place them without initiating imidization. The degree of polymerization can be changed by altering the use ratio of the diamine to the aromatic acid dianhydride.

The siloxane-containing polyamic acid resin thus obtained can be mixed with a photopolymerization initiator and provided as a photosensitive resin composition. The siloxane-containing polyamic acid resin can be used in any application that requires flexibility because pliability is maintained even after curing and suitable for a resin component to be used in a photosensitive resin composition. In addition, it has a carboxy group on its side chain, so it can be suitable for development with an alkaline aqueous solution.

The photosensitive resin composition of the present invention requires a siloxane-containing polyamic acid resin and a photopolymerization initiator as essential components. If required, the photosensitive resin composition of the present invention may be further added with any of other resins, resin components made of monomers of acrylate and the like (including monomer-containing resin component), a sensitizer, a solvent, and the like. As the photosensitive resin composition is made of the above composition, it is not only provided with superior characteristics but also with an extended range of applications thereof. In addition, a photosensitive resin composition prepared in a varnish form with the addition of a solvent is referred to as a varnish-like photosensitive resin composition, but when it is not necessary to distinguish with others, it is representatively referred to as a photosensitive resin composition. Further, any description about the amounts or ratios of the respective components (excluding the solvent) in mixture can be recognized as those in a state where a solvent is not included.

For preparing a photosensitive resin composition, when mixing with an additional acrylate, examples of the monofunctional acrylate used include 2-ethylhexyl acrylate, 2-hydroxyethyl acrylate, 2-hydroxypropyl acrylate, 2-hydroxyethyl acryloyl phosphate, 2-methoxyethoxyethyl acrylate, 2-ethoxyethoxyethyl acrylate, tetrahydrofurfuryl acrylate, phenoxyethyl acrylate, isodecyl acrylate, stearyl acrylate, lauryl acrylate, glycidyl acrylate, allyl acrylate, ethoxy acrylate, methoxy acrylate, N,N'-dimethyl aminoethyl acrylate, benzyl acrylate, 2-hydroxyethyl acryloyl phosphate, dicyclopentadienyl acrylate, and dicyclopentadiene ethoxy acrylate. Examples of polyfunctional acrylates include dicyclopentenyl acrylate, dicyclopentenyl oxyethyl acrylate, 1,3-butanediol diacrylate, 1,4-butanediol diacrylate, 1,6-butanediol diacrylate, diethylene glycol diacrylate, neopentyl glycol diacrylate, polyethylene glycol-200 diacrylate, polyethylene glycol-400 diacrylate, polyethylene glycol-600 diacrylate, diethylene glycol diacrylate, neopentyl glycol diacrylate, hydroxypivalic acid ester neopentyl glycol diacrylate, triethylene glycol diacrylate, bis (acryloxyethoxy) bisphenol A, bis(acryloxylethoxy)tetrabromo bisphenol A, tripropylene glycol diacrylate, trimethylol propane triacrylate, pentaerythritol triacrylate, tris(2-hydroxyethyl)isocyanate, pentaerythritol tetraacrylate, dipentaerythritol hexaacrylate, and dipentaerythritol monohydroxy pentaacrylate. In the photosensitive resin composition, the additional acrylate may be one or more kinds and added in an amount of 5 to 60 parts by weight, preferably 10 to 30 parts by weight with respect to 100 parts by weight of a siloxane-containing polyamic acid resin.

The photopolymerization initiator used may be any of those including, for example, acetophenone, 2,2-dimethoxy acetophenone, p-dimethyl aminoacetophenone, Michler's ketone, benzil, benzoin, benzoin methyl ether, benzoin ethyl ether, benzoin isopropyl ether, benzoin n-propyl ether, benzoin isopropyl ether, benzoin n-butyl ether, benzyl dimethyl ketal, thioxanthone, 2-choloro thioxanthone, 2-methyl thioxanthone, 2-hydroxy-2-methyl-1-phenyl-1-one, 1-(4-isopropylphenyl)-2-hydroxy-2-methyl propane-1-one, methyl benzoyl formate, and 1-hydroxycyclohexyl phenyl ketone. The photopolymerization initiator may be preferably used in an amount of 1 to 20 parts by weight, preferably 1 to 10 parts with respect to 100 parts by weight of the siloxane-containing polyamic acid resin.

Further, it is favorable to add a sensitizer to the composition. In this case, the sensitizer to be used may be any of various amines such as benzophenone. The sensitizer may be added in an amount of 0.01 to 2 parts by weight, preferably 0.05 to 0.5 parts by weight with respect to 100 parts by weight of a siloxane-containing polyamic acid resin.

The viscosity or the like of the photosensitive resin composition of the present invention can be adjusted by any of various organic solvents. Preferable organic solvents to be used include, for example, triethylene glycol dimethyl ether, diethylene glycol dimethyl ether, dimethyl acetoamide, N-methyl pyrrolidone, propylene glycol monomethyl ether acetate, ethyl lactate, or a mixture thereof. The amount of the solvent used is preferably in the range of 10 to 200 parts by weight with respect to 100 parts by weight of a solid content of the photosensitive resin composition. Note that, a photosensitive resin composition containing 10% by weight or more of a solvent and being in a liquid state at normal temperature is referred to as a varnish-like photosensitive resin composition. In addition, when an organic solvent to be used as a reaction solvent in the production of a polyamic acid resin remains, it can be calculated as a solvent.

An additional component having a functional group to be reacted with a carboxy group of epoxy or the like can be added to the photosensitive resin composition. The addition of such a component may be less than 10 parts by weight, preferably less than 5 parts by weight with respect to 100 parts by weight of the solid content of the photosensitive resin composition without impairing storage stability at room temperature.

Further, the photosensitive resin composition may be added with a known pigment such as phthalocyanine green or phthalocyanine blue, if required, as far as it does not impair the characteristic features of the composition as a solder resist. In this case, a preferable amount of the pigment to be added is 1 to 20% by weight with respect to the photosensitive resin composition (solid content). Further, the photosensitive resin composition of the present invention may be added with a known filler if required and may be applied to a photosensitive paint.

A preferable composition of the solid content (including a monomer and excluding a solvent) of the present invention is as follows:

Siloxane-containing polyamic acid resin: 50 to 99% by weight, preferably 60 to 90% by weight, photopolymerization initiator: 1 to 20% by weight, preferably 2 to 10% by weight, sensitizer: 0 to 2% by weight, preferably 0.05 to 0.5% by weight, and additional resin, a resin component made of a monomer of acrylate or the like: 0 to 45% by weight, preferably 10 to 30% by weight.

The photosensitive resin composition of the present invention contains the above various additives and a solvent in the resin component, which are preferably in the above percentages and uniformly mixed together to realize flexibility and other characteristic features thereof. In addition, the photosensitive resin composition may be in the form of a viscous liquid, varnish, or ink, or in the shape of a film formed by applying it on a substrate film and drying.

The photosensitive resin composition of the present invention can be used in accordance with any usage commonly known in the art. For applying the photosensitive resin composition to a wiring substrate (circuit substrate), it may be directly coated on the wiring substrate so as to be 5 to 100 μm in thickness, preferably 10 to 40 μm in thickness using a clean printer or coater. The coated composition is appropriately subjected to preliminary drying at a temperature of 50 to 120° C. and then selectively exposed using a photomask on which a predetermined mask pattern is formed. Subsequently, an unexposed portion is developed by an alkaline aqueous solution and then may be cured by a heat treatment at 120 to 200° C. for 20 to 120 minutes. Further, a method, which can also be applied, may be of forming a photosensitive resin composition into a film in advance and laminating the film on a wiring substrate. The same method as described above for exposing, developing, and heat-curing can also be applied to the laminated circuit substrate thus obtained.

As described above, the laminated body composed of the wiring substrate/photosensitive resin layer obtained by coating or lamination can be preferably used particularly in the process of forming a flexible wiring substrate because the photosensitive resin composition of the present invention is excellent in flexibility. In addition, the wiring substrate using the photosensitive resin composition of the present invention has well-balanced characteristics such as heat resistance, plating resistance, and humidity resistance of a cured material of the photosensitive resin composition, so the wiring substrate using the photosensitive resin composition of the present invention can be suitably employed in any application which requires such characteristics.

For making the photosensitive resin composition of the present invention into a film-shaped photosensitive resin composition, a previously model released substrate, such as a PET film, is coated with a solution of the photosensitive resin composition in a film thickness of 5 to 100 μm, preferably 10 to 50 μm and then preliminary dried at 50 to 210° C., preferably 80 to 140° C. In addition, when the film-shaped photosensitive resin composition is applied to a wiring substrate, a method of thermo-compression bonding on a wiring substrate using a laminator is common. In this case, the lamination is preferably carried out at a temperature of 20 to 100° C. The siloxane denatured polyamic acid resin of the present invention has a double bond and carboxylic acid groups, so it can be made into a cured material having a three-dimensional structure as a result of polymerization by light, heat, or the like, while retaining the flexibility because of containing a siloxane unit. Consequently, compared with a usual photosensitive resin alone or a mixture thereof, excellent heat resistance, humidity resistance, plating resistance, and pliability can be imparted.

The film-shaped photosensitive resin composition of the present invention is excellent in photolithographic property. In addition, when cured, the film-shaped photosensitive resin composition has an appropriate pliability as well as excellent folding-endurance. The cured film has a preferable elastic modulus of 0.1 to 1 GPa, more preferably 0.2 to 0.8 GPa. When the elastic modulus of the film exceeds 1 GPa, the substrate may warp extensively and result in a decrease in workability thereof. On the other hand, when the elastic modulus of the film does not reach to 0.1 GPa, it tends to lower the heat resistance and the strength.

EXAMPLES

Hereinafter, examples of the present invention will be specifically described.

First, a synthetic examples of siloxane-containing polyamic acid resins used in the examples will be described, respectively.

Synthetic Example 1

In a reaction chamber equipped with a nitrogen-inlet nozzle, 102.2 g of benzophenone tetracarboxylic dianhydride (BTDA) was dissolved in 460 g of dimethyl acetamide and then the reaction chamber was cooled on ice. Subsequently, the resultant was added with 15.0 g of 2,2'-divinyl-4,4'-diamino-biphenyl, i.e., a diamine in which $R_3$ of the formula (2) was a direct bond, an amino group was located on a para-position, and a vinyl group was located on a meta-position. Subsequently, 188.4 g of siloxane diamine (BY16-853X, manufactured by Dow Corning Toray Co., Ltd.) having a number average molecular weight of about 750, in which $R_1$ of the formula (1) was $CH_3$, $R_2$ was $(CH_2)_3$, and l was 7 to 8, was dropwise added to the reaction chamber for 1 hour under nitrogen atmosphere. After the dropping, the inner temperature of the reaction chamber was returned to room temperature and then content thereof was stirred for 5 hours under nitrogen atmosphere, thereby obtaining an aimed siloxane-containing polyamic acid resin solution. As a result of the measurement with GPC (converted with a polystyrene standard), the resulting siloxane-containing polyamic acid solution had a number average molecular weight of $3.3 \times 10^4$ and a molecular weight distribution of 2.64. In addition, the siloxane-containing polyamic acid resin in dimethyl acetamide solution (resin concentration: 40.4 wt %) had a viscosity of 7589 cPa·s at 25° C. when measured using an E-type viscometer.

Synthetic Example 2

In a reaction chamber equipped with a nitrogen-inlet nozzle, 93.3 g of biphenyl tetracarboxylic dianhydride (BPDA) was dissolved in 450 g of dimethyl acetamide and then the reaction chamber was cooled on ice. Subsequently, 5.0 g of the above 2,2'-divinyl-4,4'-diamino-biphenyl was added to the reaction chamber. Subsequently, 188.4 g of BY16-853X was dropwise added to the reaction chamber for 1 hour under nitrogen atmosphere. After the dropping, the inner temperature of the reaction chamber was returned to room temperature and then the content thereof was stirred for 5 hours under nitrogen atmosphere, thereby obtaining a siloxane-containing polyamic acid resin solution.

Synthetic Example 3

In a reaction chamber equipped with a nitrogen-inlet nozzle, 102.2 g of benzophenone tetracarboxylic dianhydride (BTDA) was dissolved in 450 g of dimethyl acetamide and then the reaction chamber was cooled on ice. Subsequently, 237.8 g of BY16-853X was dropwise added to the reaction chamber for 1 hour under nitrogen atmosphere. After the dropping, the inner temperature of the reaction chamber was returned to room temperature and then content thereof was stirred for 5 hours under nitrogen atmosphere, thereby obtaining a siloxane-containing polyamic acid resin solution.

Synthetic Example 4

In a reaction chamber equipped with a nitrogen-inlet nozzle, 102.2 g of benzophenone tetracarboxylic dianhydride (BTDA) was dissolved in 460 g of dimethyl acetamide and then the reaction chamber was cooled on ice. Subsequently, 15.0 g of 2,2'-divinyl-4,4'-diamino-biphenyl and 38.1 g of diamino diphenyl ether (DAPE) were added to the reaction chamber. Subsequently, 47.1 g of BY16-853X was dropwise added to the reaction chamber for 1 hour under nitrogen atmosphere. After the dropping, the inner temperature of the reaction chamber was returned to room temperature and then the content thereof was stirred for 5 hours under nitrogen atmosphere, thereby obtaining a siloxane-containing polyamic acid resin solution.

Example 1

The siloxane-containing polyamic acid resin solution prepared by Synthetic Example 1 (as a siloxane-containing polyamic acid resin, 100 parts by weight, the same for the following) was mixed with 30 parts by weight of trimethylol propane trimethacrylate (SR-350, manufactured by Nippon Kayaku Co., Ltd.) and 5 parts by weight of a photopolymerization initiator (CGI-124, manufactured by Ciba Specialty Chemicals Inc.). Subsequently, it was applied on a previously model-released PET film to form a coating so as to be of 25 μm in dried film thickness and then dried at 110° C. for 10 minutes, thereby obtaining a film-shaped photosensitive resin composition. The elastic modulus of the film-shaped photosensitive resin composition after the curing was 0.2 GPa. Note that, the elastic modulus is a value of E' (storage elastic modulus) at a room-temperature region when measured at a basic frequency of 11 Hz using a dynamic viscoelastic measurement device (DMA) after allowing the film-shaped photosensitive resin composition to be exposed, developed, and cured.

Example 2

A film-shaped photosensitive resin composition was obtained in a manner similar to Example 1 except that, instead of trimethylol propane trimethacrylate, 30 parts by weight of dipentaerythritol hexaacrylate (DPHA, manufactured by Nippon Kayaku Co., Ltd.) having 6 acrylic groups in one molecule was mixed with the siloxane-containing polyamic acid resin solution prepared by Synthetic Example 1. The elastic modulus of the film-shaped photosensitive resin composition after the curing was 0.2 GPa.

Example 3

A film-shaped photosensitive resin composition was obtained by mixing 30 parts by weight of SR-350 and 5 parts by weight of CGI-124 with the siloxane-containing polyamic acid resin solution prepared by Synthetic Example 2 and applying it on a previously model-released PET film, followed by drying at 110° C. for 10 minutes. The elastic modulus of the film-shaped photosensitive resin composition after the curing was 0.3 GPa.

Comparative Example 1

A film-shaped photosensitive resin composition was obtained by procedures of mixing and film-formation in a manner similar to Example 1 except that the siloxane-containing polyamic acid resin used in this example was one prepared by Synthetic Example 3. The elastic modulus of the film-shaped photosensitive resin composition after the curing was 0.08 GPa.

Comparative Example 2

A film-shaped photosensitive resin composition was obtained by procedures of mixing and film-formation in a manner similar to Example 1 except that the siloxane-containing polyamic acid resin used in this example was one prepared by Synthetic Example 4. The elastic modulus of the film-shaped photosensitive resin composition after the curing was 1.2 GPa.

For the film-shaped photosensitive resin compositions obtained in the above examples and comparative examples, photolithographic property, warping after development, folding-endurance characteristics, and storage stability at room temperature were evaluated by the following evaluation procedures. The evaluation results of the characteristics as well as the mixing ratios are shown in Table 1. In the table, part(s) represents part(s) by weight.

Photolithography was evaluated whether Via with a diameter of 500 μm was resolved in a 1% aqueous sodium carbonate solution. Specifically, a film-shaped photosensitive resin composition with a film thickness of 25 μm was laminated on the copper-foil surface of a flexible substrate (ESPANEX: MC12-20-00CEM, manufactured by Nippon Steel Chemical Co., Ltd.) by a thermocompression-bonding type roll laminator at a pressure of 1 Mpa at 80° C. It was masked with an evaluation mask and then exposed by about 400 mJ of an exposing device (high-pressure mercury lamp, manufactured by HighTech Co., Ltd.). The development was carried out using a 1% aqueous sodium carbonate solution at 30° C. for 50 to 200 seconds, followed by washing with pure water. It was evaluated as allowable (o) when no rough surface was observed and Via of 500 μm in diameter was resolved. In contrast, it was evaluated as unallowable (x) when such a resolution could not be attained.

Warping was evaluated such that the height of a dome was evaluated using the above flexible substrate. Specifically, a film-shaped photosensitive resin composition of 25 μm in film thickness was laminated, exposed, and developed on the above flexible substrate under the conditions as described above, followed by curing at 160° C. for 60 minutes. The resulting flexible substrate on which an insulating coating was formed was cut into the predetermined shapes (40 mm×40 mm), followed by determining the height of a dome. It was evaluated as allowable (o) when the height of the dome was less than 5 mm. In contrast, it was evaluated as unallowable (x) when the height of the dome was 5 mm or more.

A folding endurance test was carried out such that the number of times until a test piece could be broken away in a 180° seam-folding test was evaluated. Specifically, a film-shaped photosensitive resin composition of 25 μm in film thickness was laminated on a shining surface of a copper foil (3EC-III, manufactured by Mitsui Mining And Smelting Co., Ltd.) of 12 μm in film thickness and then exposed, developed, and cured, followed by removing all the copper foil by etching. The resulting film-cured product was cut into the shapes of 8 mm in width and 100 mm in length and then subjected to a 180° seam-folding test, and evaluated by the number of times until a test piece was broken away. It was evaluated as allowable (o) when the number of times was 10 or more. In contrast, it was evaluated as unallowable (x) when less than 10.

The storage stability was evaluated such that the film-shaped photosensitive resin composition was left standing for 2 weeks at 23° C. while shading. The photolithographic evaluation was then carried out as described above. It was evaluated as allowable (o) when the photolithographic property was good. In contrast, it was evaluated as unallowable (x) when the photolithographic property was poor.

TABLE 1

|  | Ex. 1 | Ex. 2 | Ex. 3 | Comp. Ex. 1 | Comp. Ex. 2 |
|---|---|---|---|---|---|
| Polyamic acid resin (parts) | Synth. Ex. 1 100 | Synth. Ex. 2 100 | Synth. Ex. 2 100 | Synth. Ex. 3 100 | Synth. Ex. 4 100 |
| Acrylate compound (parts) | 30 (SR-350) | 30 (DPHA) | 30 (SR-350) | 30 (SR-350) | 30 (SR-350) |
| Photopolymerization initiator (CGI124) (parts) | 5 | 5 | 5 | 5 | 5 |
| Photolithographic property | ○ | ○ | ○ | X | ○ |
| Warping | ○ | ○ | ○ | ○ | X |
| Folding-endurance | ○ | ○ | ○ | ○ | X |
| Storage stability | ○ | ○ | ○ | X | ○ |

INDUSTRIAL APPLICABILITY

The photosensitive resin composition of the present invention has a high storage stability and is capable of being developed in an aqueous dilute alkaline solution after the process of forming a circuit using ultraviolet and being cured at low temperatures of 200° C. and below. Therefore, the photosensitive resin composition of the present invention can be suitably used for a solder resist mask, a plating resist mask, or the like in the production of a flexible print-wiring plate. Further, cured material thereof has a high pliability and is excellent in folding-endurance and flexing properties, so it can be preferably used as a resist for a flexible print-wiring plate that requires those properties with respect to pliability.

The invention claimed is:

1. A photosensitive resin composition which is prepared by combining 1 to 20 parts by weight of a photopolymerization initiator as an essential component with respect to 100 parts by weight of a siloxane-containing polyamic acid resin containing 50 to 80 mol % of a structural unit represented by the following formula (1), 5 to 30 mol % of a structural unit represented by the following formula (2), and 5 to 30 mol % of a structural unit represented by the following formula (3):

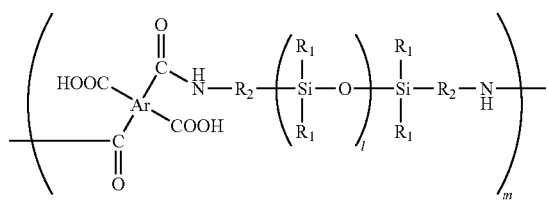
(1)

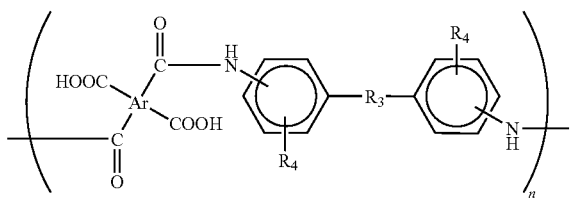
(2)

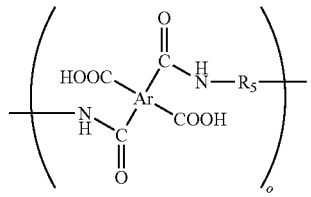
(3)

wherein
Ar represents a tetravalent tetracarboxylic acid residue in which carboxyl groups are removed from an aromatic tetracarboxylic acid, $R_1$ represents an alkyl group having 1 to 6 carbon atoms or phenyl group, $R_2$ represents an alkylene group having 2 to 6 carbon atoms or phenylene group, l represents a number of 0 to 10, $R_3$ represents a divalent group or a direct bond, $R_4$ represents a group represented by $CH_2$=CH—$R_6$—, $R_6$ represents a direct bond, an alkylene group having 1 to 6 carbon atoms, or a phenylene group, $R_5$ represents a divalent diamine residue in which an amino group is removed from a diamine compound, except in the case of the divalent diamine residue being diamine residues in the formulae (1) and (2), and m, n, and o represent abundant molar ratios of the respective structural units, where m is in the range of 50 to 80, n is in the range of 5 to 30, and o is in the range of 5 to 30.

2. A photosensitive resin composition according to claim 1, wherein the photosensitive resin composition is prepared by combining 1 to 20 parts by weight of the photopolymerization initiator and 5 to 60 parts by weight of a monofunctional or polyfunctional acrylate as essential components with respect to 100 parts by weight of a siloxane-containing polyamic acid resin.

3. A varnish-like photosensitive resin composition, which is prepared by adding a solvent to the photosensitive resin composition according to claim 1.

4. A film-shaped photosensitive resin composition, which is prepared by applying and drying a varnish-like photosensitive resin composition according to claim 3 on a substrate film.

5. A circuit substrate on which a negative-type insulating coating is formed, which is obtained by forming a coating of a photoconductive resin composition according to claim 1 on the circuit substrate on which a conductive layer is patterned, followed by exposing, developing, and curing.

6. A varnish-like photosensitive resin composition, which is prepared by adding a solvent to the photosensitive resin composition according to claim 2.

7. A film-shaped photosensitive resin composition, which is prepared by applying and drying a varnish-like photosensitive resin composition according to claim 6 on a substrate film.

8. A circuit substrate on which a negative-type insulating coating is formed, which is obtained by forming a coating of a photoconductive resin composition according to claim 2 on the circuit substrate on which a conductive layer is patterned, followed by exposing, developing, and curing.

9. A circuit substrate on which a negative-type insulating coating is formed, which is obtained by forming a coating of a photoconductive resin composition according to claim 3 on the circuit substrate on which a conductive layer is patterned, followed by exposing, developing, and curing.

10. A circuit substrate on which a negative-type insulating coating is formed, which is obtained by forming a coating of a photoconductive resin composition according to claim 6 on the circuit substrate on which a conductive layer is patterned, followed by exposing, developing, and curing.

\* \* \* \* \*